US005491601A

United States Patent [19]
Arntz

[11] Patent Number: 5,491,601
[45] Date of Patent: Feb. 13, 1996

[54] CIRCUIT FOR DETECTING A SHORT CIRCUIT IN A LOW SIDE DRIVEN LOAD

[75] Inventor: Robert T. Arntz, Auburn Hills, Mich.

[73] Assignee: Chrysler Corporation, Highland Park, Mich.

[21] Appl. No.: 358,090

[22] Filed: Dec. 15, 1994

[51] Int. Cl.$^6$ ...................................................... H02H 3/18
[52] U.S. Cl. ................................................ 361/79; 361/86
[58] Field of Search .......................... 361/18, 86, 88–89, 361/91, 33, 78–79

[56] References Cited

U.S. PATENT DOCUMENTS

| 4,355,341 | 10/1982 | Kaplan | 361/79 |
| 5,138,516 | 8/1992 | Chapman | 361/18 |
| 5,166,852 | 11/1992 | Sano | 361/42 |

*Primary Examiner*—A. D. Pellinen
*Assistant Examiner*—Michael J. Sherry
*Attorney, Agent, or Firm*—Christopher A. Taravella

[57] ABSTRACT

A circuit is provided for detecting a short circuit in a remote low-side driven load wherein a single conductor is used to both transmit a control signal from a microprocessor controller through a local driver to the remote driver of the load and also to transmit fault signals from the remotely driven load back to the control means. A control signal is transmitted from the microprocessor controller through a local driver circuit to a remote driver circuit on a single conductor. A short circuit at the remote load causes a fault signal to be latched for later detection by the microprocessor and a short circuit at the local driver is immediately detected.

14 Claims, 2 Drawing Sheets

CIRCUIT FOR DETECTING A SHORT CIRCUIT IN A LOW SIDE DRIVEN LOAD

BACKGROUND OF THE INVENTION

The present invention relates to the detection of a short circuit condition in a load and, more particularly, it relates to the detection of a short circuit to battery condition in a remote low-side driven load.

Low-side switching systems are widely employed in automotive applications, such as in the control of devices, such as fuel solenoids. A typical low side driver includes protection for a short circuit condition in the load, that is, it includes a short circuit to battery protection circuit.

In many applications, it is desirable to provide a low-side driver at a load positioned in a location remote from the microprocessor controlling it. For example, it may be necessary to provide a driver for a fuel solenoid at a location far from the engine controller unit. In this type of application, it is critical to keep the number of conductors from the microcontroller to the remote driver to an absolute minimum. The reduction by even one conductor results in a great cost savings in a mass produced product. It is therefore desirable to utilize a single conductor to send control signals to a remote driver, and to receive fault signal feedback over the same conductor.

Also, there are situations where an existing driver circuit must be used to drive a load, however, the driver circuit is not adequately rated for the application. For example, the driver circuit may be rated for only one amp while a current of three amps is required. The existing driver may be part of a larger system that is already in production, thus it may not be easily modified due to cost factors. Therefore, it may be necessary to utilize the existing driver to drive a second remote driver rated for three amps. As described above, it is desirable to keep the number of conductors between the drivers to a minimum.

A high-side switching system used for vehicle AC regulators is disclosed in U.S. Pat. No. 5,166,852 to Sano. The Sano system comprises a detection circuit for detecting the removal of an external ground terminal from a load, e.g., an electronic device, and a protection circuit for protecting the circuits of the electronic device in response to a signal from the detection circuit. The protection circuit includes a low voltage protection circuit for blocking the operation of an output transistor of the electronic device, a memory circuit responsive to signals from both the detection circuit and the low voltage protection circuit, and an input cut-off circuit for cutting off input signals to the electronic device.

U.S. Pat. No. 5,138,516 to Chapman describes a driver circuit with a minimum number of interconnections between it and an output driver circuit, that controls the operation of the output driver circuit. The driver circuit additionally senses fault conditions within the output driver device. However, as is clear from FIG. 1 of the Chapman drawings, the circuit requires a minimum of two interconnections between itself and the output driver circuit.

SUMMARY OF THE INVENTION

It is an object of the present invention to provide a system that requires only a single conductor to both control a low-side driver, and provide a feedback fault signal.

It is another object of the invention to control a remote low-side driver from an existing driver.

In an illustrative embodiment of the invention, a circuit is provided for detecting a short circuit in a remote low-side driven load wherein a single conductor is used to both transmit a control signal from a control means through a local driver to the remote driver of the load and also to transmit fault signals from the remotely driven load back to the control means. According to the preferred embodiment, a control signal is transmitted from a microprocessor through a local driver circuit to a remote driver circuit on a single conductor. The control signal sets an RS flip-flop and additionally turns on the remote driver circuit. The remote driver circuit grounds a load that is connected to a voltage source, thus allowing current to flow to the load. The grounded signal is compared in a remote comparator to a reference voltage. Under normal conditions, the voltage level of the grounded signal is less than the reference voltage, thus the remote comparator applies a high signal to the reset input of the RS flip-flop, resetting it, so it generates a low signal on its Q output. The low signal from the flip-flop is applied to an inverter and the resulting high signal is applied to a high voltage feedback switch, keeping the switch off. The signal on the single conductor is divided down to a level below a second reference voltage. The divided signal is compared to the second reference voltage in a local comparator, the resulting high signal from the local comparator maintains the local driver circuit in an "on" condition, where the driver circuit grounds the signal on the single conductor. The microprocessor samples the signal on the single conductor, a signal level near ground indicating normal operation.

If, however, there is a short in the load to the battery voltage, the voltage level of the signal at the remote comparator is greater than the reference voltage. Thus the remote comparator will not reset the flip-flop, the Q signal from the flip-flop is latched, and further, the remote comparator turns off the remote driver. Also, the flip-flop applies a high signal to the inverter and the resulting low signal from the output of the inverter is applied to the high voltage feedback switch, turning the switch on. A high voltage signal from the switch is applied to the single conductor which is pulled to ground by the local driver until the microprocessor terminates the transmission of the control signal. When the control signal is terminated, the local driver is turned off, thus the signal on the single conductor is no longer grounded. The microprocessor samples the signal on the single conductor through the voltage divider. The high signal from the high voltage feedback switch indicates a fault condition.

BRIEF DESCRIPTION OF THE DRAWINGS

The foregoing and other features of the present invention will be more readily apparent from the following detailed description of preferred embodiments taken in conjunction with the attached drawings, wherein.

DETAILED DESCRIPTION OF PREFERRED EMBODIMENTS

Figure 1:
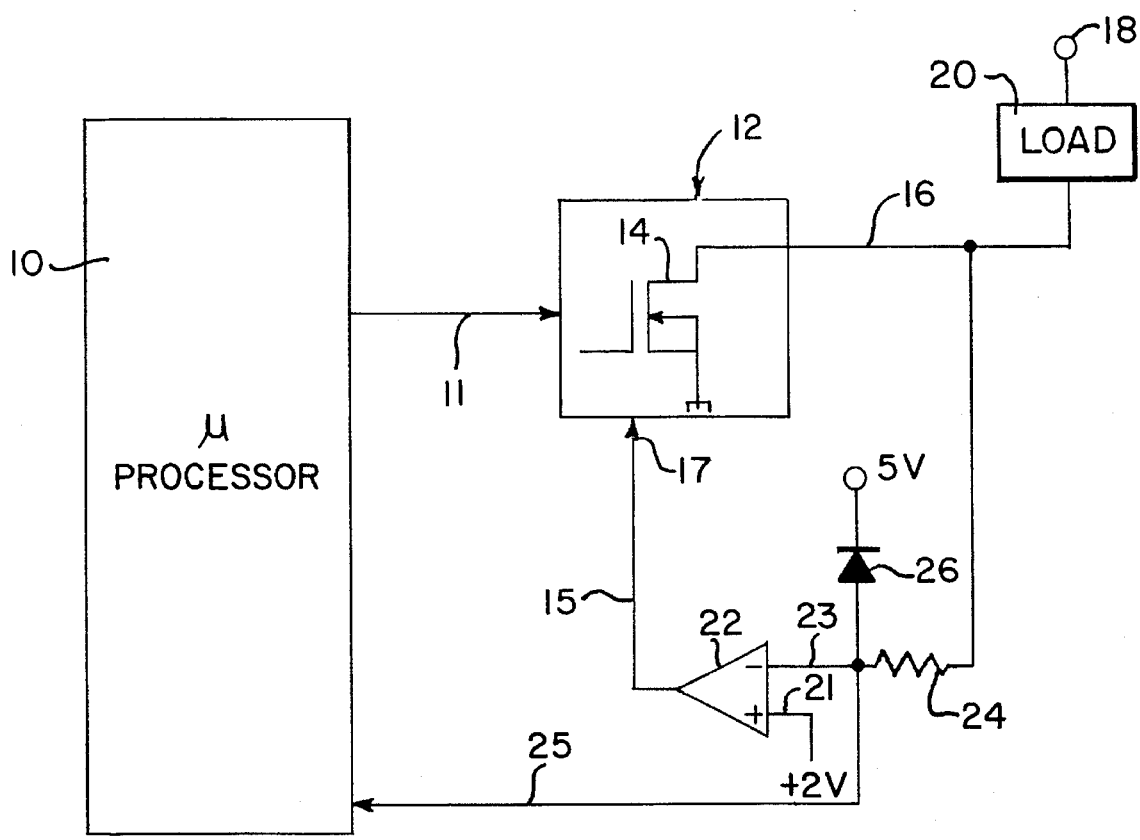
FIG. 1 is a diagram of a prior art low-side driver.

A typical microprocessor controlled low-side switching system is illustrated in FIG. 1. This particular type of switching system has been used in vehicle engine controllers. Referring to FIG. 1, a microprocessor 10 transmits a high control signal over line 11 to the driver circuit 12. In response to the high signal, an electronic switch or transistor 14 within the driver circuit 12 turns on, pulling the output line 16 to ground. As is evident from the figure, when the output line 16 is pulled to ground, current flows from the battery 18 through the load 20 and driver 14 to ground.

Comparator 22 compares the signal on the output line 16, which is delivered through resistor 24 to its input 23, to a two volt reference at its input 21. Under normal conditions, the signal on the output line 16, as measured through resistor 24, is less than two volts, and, in fact, it is at or close to zero volts or ground since the driver 12 pulls the signal on output line 16 to ground. Thus the comparator 22 applies a high signal on line 15 to a disable terminal 17 of the driver circuit 12. The microprocessor 10 also pulls line 25, which is related to the voltage on the output line 16 as seen through resistor 24, to determine the status of the line 16. A low signal on the output line 16 indicates that there is no fault condition. When no control pulse is present on line 11, diode 26 clamps comparator input 23 to a 5 volt level.

During operation, if there is a short circuit to battery condition, that is, there is a short circuit through the load 20, the signal on output line 16 will be approximately equal to the potential of the battery 18. The signal as measured through resistor 24 is thus significantly higher than the two volt reference. The signal is compared to the two volt reference in the local comparator 22 and the resulting low signal is applied to the disable terminal 17 of the driver circuit 12, which serves to disable the driver circuit 12.

As indicated above, the microprocessor 10 polls the output line 16 through resistor 24. The sensing of a high signal on the output line 16 indicates a problem, thus microprocessor 10 takes appropriate action.

Figure 2:
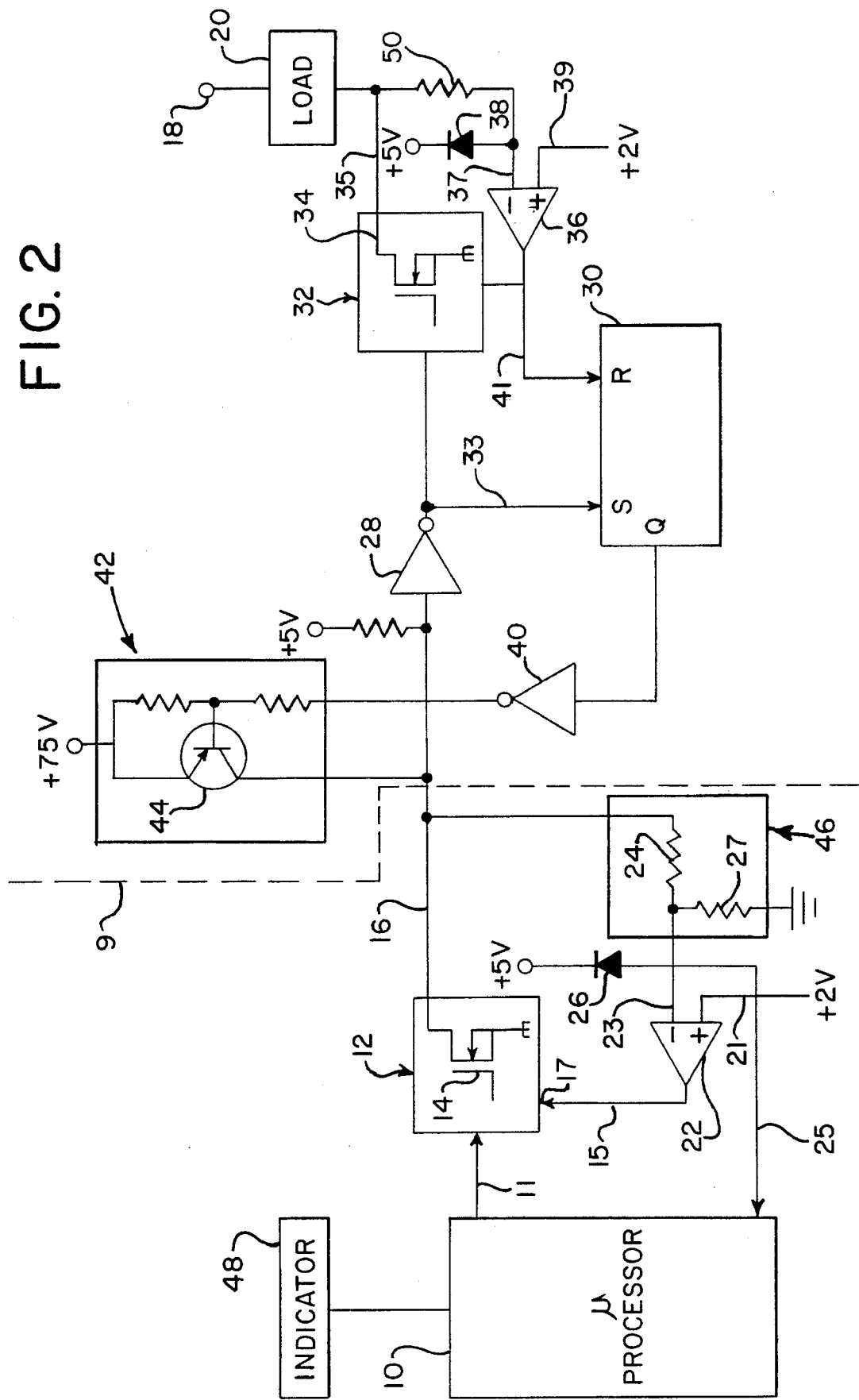
FIG. 2 is a diagram of the preferred embodiment of the remote low-side driver of the present invention.

FIG. 2 illustrates a preferred embodiment of the present invention used with a low-side driver in a vehicle's engine controller unit. The portion to the left of the dotted line 9, located within the engine controller unit, is similar to the prior art system described in connection with FIG. 1, but it includes an additional resistor 27. The portion of the circuit to the right of the dotted line 9 represents a low side driver according to the invention which is at a location remote from the engine controller unit. Note in particular that the two portions are connected by a single conductor 16.

In normal operation, when microprocessor 10 is required to drive the load 20, the microprocessor 10 transmits a high control signal over line 11 to local driver circuit 12 which includes a transistor 14. Microprocessor 10 lights an indicator 48 attached to microprocessor 10 in response to the high voltage signal. In response to the high signal, the transistor 14 turns on, pulling the signal on conductor 16 low. The low signal is applied to an inverter 28. The corresponding high signal from the output of inverter 28 sets an RS flip-flop 30 over line 33. The high signal is also applied to a remote driver circuit 32 which includes a transistor 34. The high signal turns on the transistor 34, grounding a conductor 35 and allowing current to flow from battery 18 through the remote load 20 and transistor 34.

Also, as a result of setting the flip-flop 30, a high signal is latched to the Q output of flip-flop 30, and the high output is applied to an inverter 40 and the resulting low signal from the output of the inverter 40 is applied to a high voltage feedback switch 42, that includes a transistor 44. The low signal from the inverter 40 turns on the switch 42.

The signal on conductor 35 is applied, through a resistor 50, to the negative terminal 37 of remote comparator 36 and is compared to a reference voltage, preferably two volts, on input 39 of the comparator. Under normal operating conditions, before the control pulse is applied to line 11, the negative input 37 of remote comparator 36 is clamped at 5 volts by diode 38 and resistor 50 in the same manner that diode 26 clamps the input 23 of local comparator 22 to that voltage. When the control pulse is present under normal conditions, the signal on conductor 35 will be at or close to ground because the remote driver 32 is on. Thus the comparison at remote comparator 36 will result in a high signal. The high signal is applied to the remote driver circuit 32 over line 41, maintaining the remote driver circuit 32 in its "on" condition. The high signal is also applied to the reset input of flip-flop 30, resetting it, and unlatching the fault signal.

The flip-flop 30 generates a low signal at its Q output as a result of the reset. The low signal is inverted at inverter 40 and the resulting high signal is applied to the high voltage feedback switch 42 and its transistor 44. The switch 42 is thus turned off. It should be noted that under normal conditions, the switch 42 remains on only for about 10 microseconds.

Switch 42 has a high voltage (e.g. 75 volts) applied to it. The pnp transistor 44 has its emitter connected to the high voltage and its base connected to the center of a voltage divider made up of two resistors connected in series between the high voltage and the output of the inverter 40. As a result, the output of inverter 40 determines whether the conductor 16 is pulled toward the high voltage by transistor 44. However, as one of ordinary skill in the art will appreciate, when the high voltage switch 42 is turned on while the local driver 12 is turned on, the signal on the conductor 16 is grounded.

The signal on conductor 16 is applied to resistors 24 and 27, configured as a voltage divider 46. The resulting signal, applied to the negative terminal 23 of the local comparator 22, is compared to the reference voltage, preferably two volts, on terminal 21. Under normal operating conditions, this signal is lower than the reference voltage, and in fact at about ground. Thus the local comparator 22 applies a high signal to the disable terminal 17 of the local driver circuit 12, maintaining the local driver 12 in its on condition.

The signal on the conductor 16 is sampled by the microprocessor 10 through the voltage divider 46 on line 25. Since the local driver 12 grounds the signal on the conductor 16, the microprocessor 10 senses a low signal, indicating to the microprocessor 10 that there is no fault condition.

When there is a short circuit at the load 20, the transistor 34 in the remote driver circuit 32 is unable to pull the signal on conductor 35 to ground, thus the signal will remain high. This high signal is applied to the negative terminal 37 of the remote comparator 36 where it is compared to the reference voltage on terminal 39. It should be noted that the signal at the terminal 37 cannot exceed five volts because of diode 38, thus protecting comparator 36. The comparison in comparator 36 results in the application of a low signal to both the remote driver circuit 32 and the reset input of the flip-flop 30.

The application of a low signal to remote driver circuit 32 turns off the transistor 34. With the transistor 34 off, there will be no attempt to ground the conductor 35. Thus, a large current will be prevented from flowing from the battery 18 through the short and driver transistor 34. This protects remote driver 32 and the remaining portions of the circuit.

The low signal from the remote comparator 36 also fails to reset the flip-flop 30, thus the fault signal remains latched and the flip-flop 30 continues to apply a high signal to inverter 40. The low signal from the output of inverter 40 in this condition is applied to the high voltage feedback switch 42 which keeps the transistor 44 in an on condition.

The high signal on conductor 16 is grounded by the local driver 12 for the duration of the control signal from the microprocessor 10. However, once the control signal has terminated, the local driver 12 turns off, thus the conductor 16 is no longer grounded. As a result, transistor 44 pulls the signal on the conductor 16 high. The high signal now on conductor 16 is applied to the voltage divider 46, which is sampled by the microprocessor 10 over line 25 and is applied to input 23 of comparator 22. However, the voltage at the output of divider 46 (i.e., line 25) cannot exceed five volts because of diode 26, thus protecting both the comparator 22 and the microprocessor 10.

The high signal on conductor 16 causes comparator 22 to produce a low signal which blocks operation by local driver 12. This high signal on conductor 16 also indicates to the microprocessor that there is a short circuit at the remote load 20. The microprocessor 10 then takes appropriate action, such as illuminating a warning light, or actuating other systems within the vehicle. It should be noted that the microprocessor 10 can only sense the fault at the remote load 20 after the control signal from the microprocessor 10 has terminated, since the control signal causes the local driver 12 to ground the signal on conductor 16.

The microprocessor 10 is also capable of detecting a short circuit fault condition within the engine controller unit. That is, if conductor 16, prior to operation, is short circuited to a low impedance voltage source of, for example, more than five volts, the local driver 12 will be unable to pull the signal on conductor 16 to ground. Thus, the signal level on conductor 16, as measured through the voltage divider 46 will be high as compared to the reference voltage at the positive terminal of the local comparator 22. As a result, not only will the local driver 12 be turned off, but also microprocessor 10 senses a high signal indicating that there is a fault condition.

Microprocessor 10 can distinguish between a fault at the remote load and a local fault. As indicated above, a remote fault is only detected by microprocessor 10 after the termination of "the control signal from the microprocessor 10. In contrast, a local fault is detected during the control signal. Thus, a fault condition sensed before the termination of the control signal indicates a local short circuit. A fault condition sensed only after the termination of the control signal indicates a remote short circuit.

While the present invention has been particularly shown and described with reference to preferred embodiments thereof, it will be understood by those skilled in the art that various changes in form and details may be made therein without departing from the spirit and scope of the invention.

What is claimed is:

1. A circuit for driving one side of a load that has its other side electrically connected to a first voltage source, and for providing short circuit detection, comprising:

a control circuit that provides control pulse signals over a single conductor;

a remote driver with an input connected to the single conductor and an output connected to the one side of the load and a disable terminal for controlling the state of said remote driver, said remote driver connecting the one side of the load to a low level compared to the first voltage in response to the control signals provided to the input over the single conductor;

a short circuit detector that compares the remote driver output with a reference voltage so as to detect a short circuit between the first voltage source and the remote driver output, said short circuit detector provides a short circuit detection signal in response to the comparison, said detection signal being applied to the disable terminal of the remote driver as a result of detecting the short circuit; and a high voltage circuit with an output connected to the single conductor, said detection signal being effective to cause said high voltage circuit to provide a high voltage signal on the single conductor at the termination of the control pulse signal.

2. The circuit of claim 1 wherein the control circuit comprises a microprocessor that generates the control pulse signals.

3. The circuit of claim 2 wherein the circuit further comprises:

a local driver receiving control pulse signals from the microprocessor and having an output connected to the single conductor, said local driver connects the single conductor to a low level compared to the first voltage in response to the control pulse signals; and a fault detector which compares the signal on the single conductor to a certain reference voltage to detect the short circuit between the single conductor and a voltage source, said fault detector providing a fault signal at its output that turns off said local driver.

4. The circuit of claim 3 wherein the microprocessor receives the high voltage signal and responds thereto.

5. The circuit of claim 3 wherein the microprocessor lights an indicator in response to the high voltage signal.

6. The circuit of claim 3 wherein a disable terminal of the local driver receives the fault signal and responds thereto by turning off said local driver.

7. The circuit of claim 3 further comprising:

a local clamp in communication with the fault detector which clamps the signal on the single conductor to a first predetermined voltage.

8. The circuit of claim 3 further comprising:

a voltage divider in communication with the fault detector and the single conductor which applies a signal to the fault detector having a voltage level that is a predetermined fraction of a voltage level of the signal on the single conductor.

9. The circuit of claim 1 further comprising:

a remote clamp in communication with the short circuit detector which clamps the remote driver output to a second predetermined voltage.

10. The circuit of claim 1 wherein the high voltage circuit comprises:

a second voltage source; and a transistor having an emitter connected to the second voltage source, a collector connected to the single conductor through a resistor, and a base connected to a voltage divider, the voltage divider being connected between the second voltage source and the short circuit detector.

11. The circuit of claim 1 further comprising:

a memory that receives the short circuit detection signal and stores a fault condition pending termination of the control signal pulses, the fault condition in said memory being effective to operate said high voltage circuit.

12. The circuit of claim 7 wherein the memory means is a resettable flip flop which is set by the control pulse signal received over the single conductor and is reset when said short circuit detector fails to detect a short circuit condition.

13. The circuit of claim 1 wherein the low level is ground.

14. A circuit for driving one side of a load that has its other side electrically connected to a first voltage source, and for providing short circuit detection, a control circuit that provides control pulse signals over a single conductor, the control circuit comprising a microprocessor that generates the control pulse signals, a local driver receiving control pulse signals from the microprocessor and having an output connected to the single conductor, said local driver connects the single conductor to a low level compared to the first voltage in response to the control pulse signals, and a fault detector which compares the signal on the single conductor to a certain reference voltage to detect the short circuit between the single conductor and a voltage source, said fault detector providing a fault signal that turns off said local driver;

a remote driver with an input connected to the single conductor and an output connected to the one side of the load and a disable terminal for controlling the state of said remote driver, said remote driver connecting the one side of the load to a low level compared to the first voltage in response to the control signals provided to the input over the single conductor;

a short circuit detector that compares the remote driver output with a reference voltage so as to detect a short circuit between the first voltage source and the driver output, said short circuit detector provides a short circuit detection signal in response to the comparison, said detection signal being applied to the disable terminal of the remote driver as a result of detecting the short circuit; and a high voltage circuit with an output connected to the single conductor, said high voltage circuit providing a high voltage on the single conductor at the termination of the control pulse signal in response to the short circuit detection signal; and a memory that receives the short circuit detection signal and stores a fault condition pending termination of the control signal pulses, the fault condition in said memory being effective to operate said high voltage circuit.

* * * * *